United States Patent
Liehr et al.

(10) Patent No.: US 6,487,986 B1
(45) Date of Patent: Dec. 3, 2002

(54) DEVICE FOR THE PLASMA DEPOSITION OF A POLYCRYSTALLINE DIAMOND

(75) Inventors: Michael Liehr, Feldatal (DE); Lothar Schäfer, Meine (DE)

(73) Assignees: Unaxis Deutschland Holding GmbH, Hanau (DE); Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/719,525

(22) PCT Filed: Sep. 1, 1999

(86) PCT No.: PCT/EP99/06397

§ 371 (c)(1), (2), (4) Date: Dec. 13, 2000

(87) PCT Pub. No.: WO00/16374

PCT Pub. Date: Mar. 23, 2000

(30) Foreign Application Priority Data

Sep. 12, 1998 (DE) .......................... 198 41 777

(51) Int. Cl.[7] .......................... C23C 16/00; H05H 1/00; H01H 1/02

(52) U.S. Cl. .......................... 118/723 MW; 118/718; 156/345.41; 156/345.33; 427/575; 427/585

(58) Field of Search ................. 118/723 ME, 723 MW, 118/718, 719, 729, 723 MP; 156/345.41, 345.36, 345.31, 345.33; 427/575, 585

(56) References Cited

U.S. PATENT DOCUMENTS 5,372,648 A * 12/1994 Yamamoto et al. ...... 118/723 E
5,464,476 A * 11/1995 Gibb et al. ........... 118/723 MP
5,510,151 A *  4/1996 Matsuyama et al. ........ 427/509
5,900,065 A *  5/1999 Liehr et al. ........... 118/723 HC
5,985,378 A * 11/1999 Paquet ........................ 427/562
6,293,222 B1 *  9/2001 Paquet ................. 118/723 ME

FOREIGN PATENT DOCUMENTS

| DE | 19503205 | 7/1996 | |
|---|---|---|---|
| DE | 19628949 | 1/1998 | |
| EP | 0823493 | 2/1998 | |
| JP | 10-88350 A * | 4/1998 | ........... C23C/16/26 |

* cited by examiner

Primary Examiner—Gregory Mills
Assistant Examiner—P. Hassanzadeh
(74) Attorney, Agent, or Firm—Fulbright & Jaworski L.L.P.

(57) ABSTRACT

In an apparatus for depositing polycrystalline diamond by plasma technology onto substrates (5) of large area, having a process chamber (1) with airlock (6a), a plurality of microwave plasma sources (9, 9', ...) arranged in a common plane above the substrates (5) and extending transversely across the direction of substrate advancement, and gas inlet and gas outlet tubes (10, 10', ..., 11, 11', ..., 12, 12', ..., 13, 13', ..., 13a, ...) leading into the process chamber (1) are provided, a plurality of gas inlet and gas outlet tubes distributed over the length of the source are associated with each of the linear sources (9, 9', ...), and the outlet openings of the gas inlet tubes being situated each directly above the linear source (9, 9', ...), and the openings of the gas outlet tubes (13, 13', ...) each in the area between two linear sources (9, 9', ...) and in a plane which extends approximately through the core axes (5) of the linear sources (9, 9', ...).

2 Claims, 2 Drawing Sheets

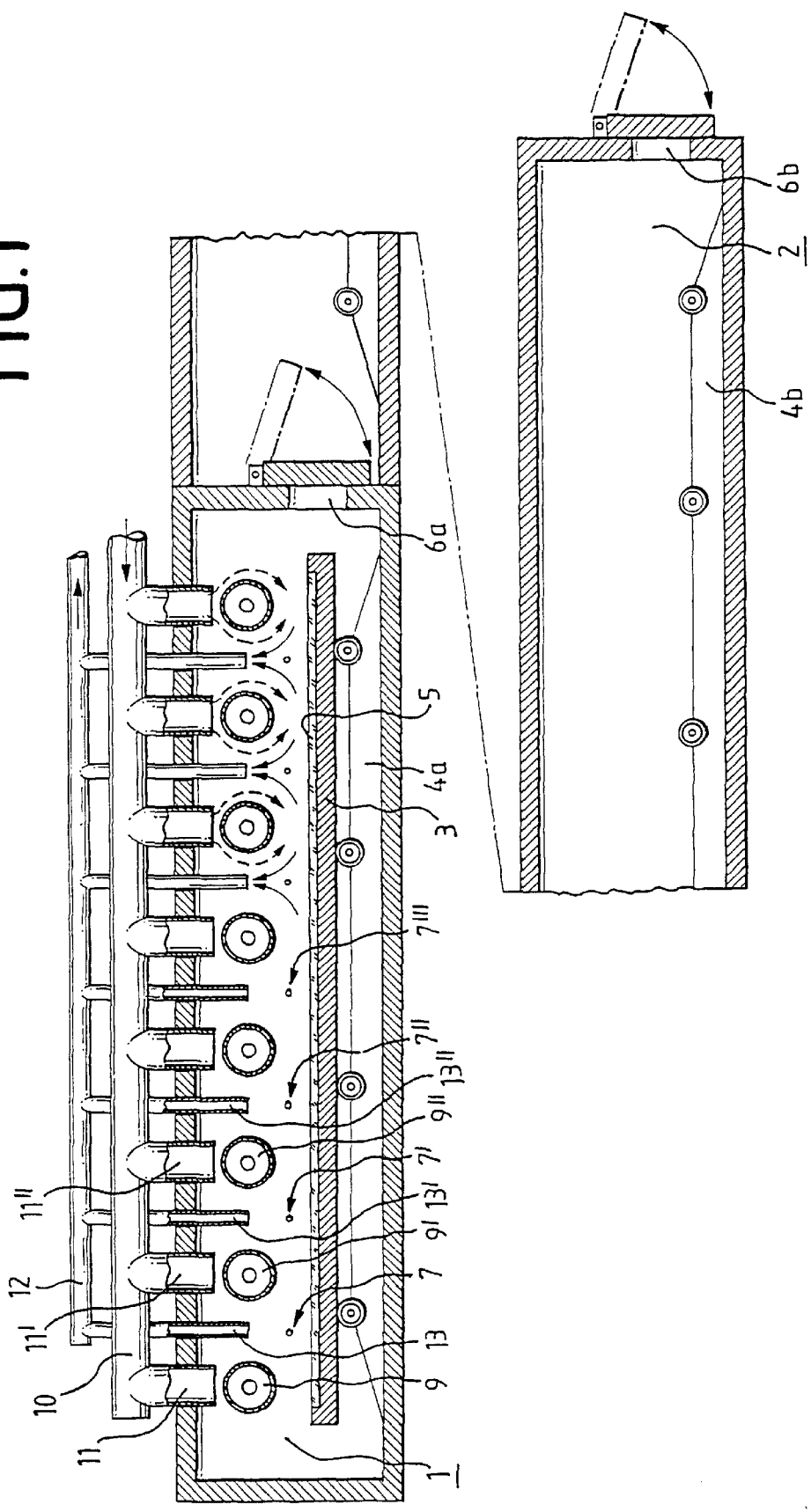

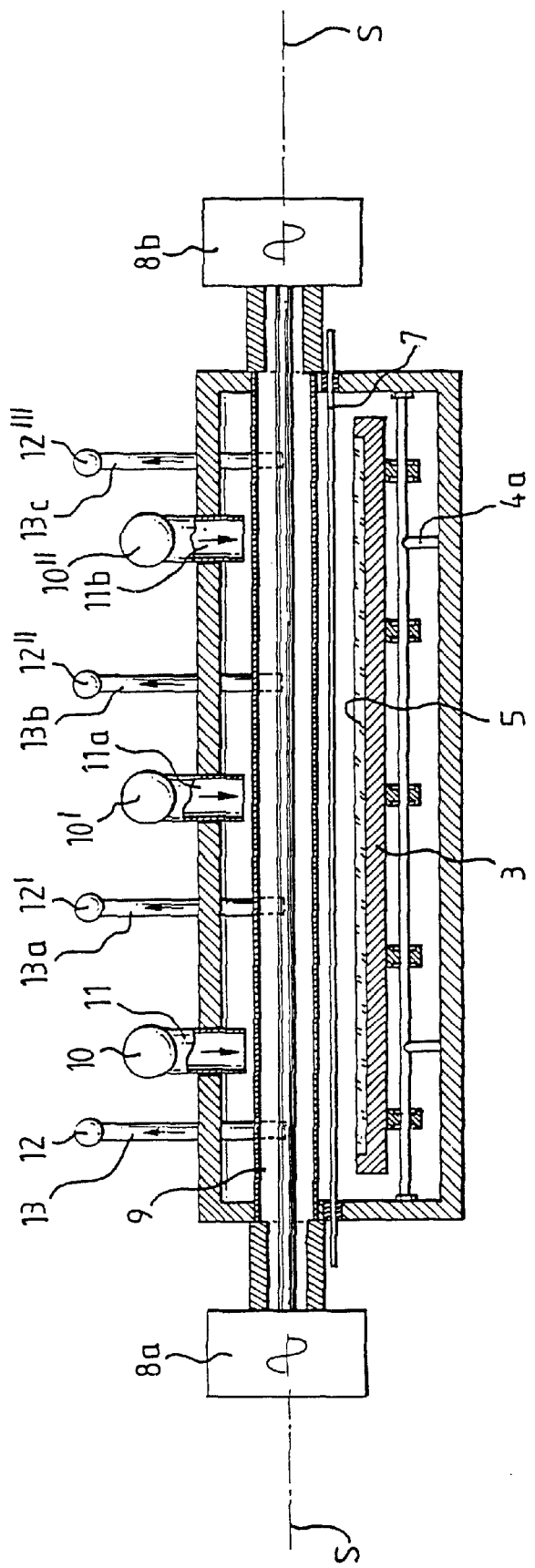

DEVICE FOR THE PLASMA DEPOSITION OF A POLYCRYSTALLINE DIAMOND

BACKGROUND OF THE INVENTION

1. Field of the Invention

The invention relates to an apparatus for depositing polycrystalline diamond by plasma technology onto flat substrates of large area, having a vacuum chamber, an airlock for the entry and exit of the substrates, and with a system within the vacuum chamber for passing the substrates through the vacuum chamber.

2. Description of the Related Art

A known apparatus for the production of plasma (DE 195 03 205) makes it possible to produce plasmas for surface treatments and coating processes in a limited range of operation (process area, gas pressure, microwave power). The known apparatus consists substantially of a cylindrical glass tube installed in a vacuum process chamber and a metallically conductive tube situated in the latter, and atmospheric pressure prevails in the interior of the glass tube. Microwave power is introduced through the walls of the vacuum process chamber bilaterally through two inputs and two metal coaxial conductors consisting of an inner conductor and an outer conductor. The outside conductor of the coaxial conductor inside of the vacuum process chamber is replaced by a plasma discharge which if the ignition conditions are sufficient, a plasma gas is ignited and sustained by the microwave power, while the microwave power can issue from the two metallic coaxial conductors and pass through the glass tube into the vacuum processing chamber. The plasma externally envelops the cylindrical gas tube and together with the inside conductor forms a coaxial conductor with a very high attenuation coefficient. With a fixed microwave power delivered on both sides, the gas pressure in the vacuum process chamber can be adjusted such that the plasma apparently burns uniformly along the apparatus where the outside conductor of the coaxial line inside of the vacuum process chamber is missing.

An apparatus for producing a plasma in a vacuum chamber has already been proposed (Patent Application DE 197 22 272.2), in which a rod-shaped conductor is carried through the vacuum chamber within a tube of insulating material, and the inside diameter of the insulating tube is greater than the diameter of the conductor, the insulating tube is held at both ends in walls of the vacuum chamber and is sealed to the walls at its external surface, and the conductor is connected at both ends to a first source for producing the alternating electromagnetic fields, and is surrounded in the area of both points of passage through the walls and for at least a short distance towards its central portion by tubular pieces of electrically conductive material, the two tubular pieces being disposed concentrically with the insulating tube, and the cylindrical spaces formed by the insulating tube and the tubular pieces are connected to a second source for the production of an alternating electromagnetic field.

It has long been known to grow diamond on diamond substrates (*Vakuumbeschichtung 5, Anwendungen Teil II*, Prof. Dr. G. Kienel, VDI-Verlag GmbH, Duesseldorf 1993).

Furthermore, the importance of atomic hydrogen during the growing process has been found. It is furthermore also known to deposit diamond coatings by hot filament methods by all kinds of plasma CVD (microwaves, RF, DC, arc discharges, plasma jet) and from $C_2H_2/O_2$ flames.

Furthermore, methods utilizing hot-wire sources, especially the parameters necessary therefor, such as pressures and process gas compositions, have been extensively described in *"Properties and Growth of Diamond,"* by Gordon Davies, Kings College, London UK, published by INSPEC, the Institution of Electrical Engineers, 1994, and in *"Current and Prospective Fields of Application for Diamond thin Films,"* by Michael Liehr, April 1995, Department of Physics, Heriot-Watt University, Edinburgh.

Lastly, an apparatus for depositing polycrystalline diamond on flat substrates of large area has been proposed (Patent Application DE 196 31 407), consisting of a vacuum chamber with locks for the entry and exit of the substrates, with a system disposed in the chamber for carrying the substrates through at least one, but preferably two, treatment stations, and with hot wire sources provided above the substrate plane and forming a first group, and with microwave plasma sources forming a second group, and with an electrode underneath the substrate plane and fed with radio frequency for producing a bias voltage, and with gas feeding tubes leading into the vacuum chamber, the hot wire systems being configured as line sources and extending across the direction of substrate transport and forming a first coating zone, the microwave plasma sources being arranged in a row spaced from and parallel to the hot wire sources, and together forming a second coating zone.

SUMMARY OF THE INVENTION

The present invention is addressed to the problem of coating large, planar substrate surfaces with super-hard carbon coatings of uniform thickness and quality.

This problem is solved according to the invention by a plurality of linear microwave plasma sources arranged parallel to one another and in a common plane above the substrates and extending transversely across the direction of substrate movement, with gas inlet and gas outlet tubes opening into the process chamber, a plurality of gas inlet and gas outlet tubes distributed over the length of the linear source being associated with each of the linear sources, and the outlet openings of the gas inlet tubes being situated immediately above the linear source, and the openings of the gas outlet tubes being arranged each in the area between two linear sources and in a plane which extends approximately through the core axes of the linear sources.

Additional details and features are described and characterized in the claims.

BRIEF DESCRIPTION OF THE DRAWINGS

FIG. 1 is a longitudinal schematic of an embodiment of a coating apparatus according to the invention.

FIG. 2 is a cross section of the apparatus of FIG. 1

DESCRIPTION OF THE INVENTION

The invention admits of a great variety of embodiments; one of them is represented in the appended drawings, FIG. 1 showing an apparatus purely schematically in a longitudinal section, and FIG. 2 showing it in cross section.

The coating apparatus consists essentially of two vacuum chambers 1 and 2 arranged in tandem, one of the chambers forming process chamber 1, the slit airlocks 6a and 6b provided in the chamber walls, the transport devices 4a and 4b, a running substrate holder 3, a plurality of gas inlet tubes 11, 11', 11" . . . and 11a . . . , 11b, joined together in the manner of a network, a corresponding number of gas outlet tubes 13, 13', 13" . . . and 13a . . . 13b, . . . joined together in the manner of a network, the linear microwave plasma sources 9, 9', 9" . . . each fed by microwave transmitters 8a, 8b . . . , and a glow wire 7, 7', 7" . . . associated with each microwave plasma source 9, 9', 9" . . .

The (flat) substrates 5 are carried on the cooled substrate carrier 3 through the vacuum chamber 2 into the process chamber 1 through the slit airlocks 6a and 6b by means of the transport devices 4a and 4b. Precursor gas is fed to the coating process through the inlet tubes 11, 11', 11" . . . and 10, 10', 10" . . . The energy necessary for the coating process is delivered through a plurality of linear microplasma sources 9, 9', 9" . . . fed by microwave transmitters 8a and 8b, and a number of glow wires 7, 7', 7", 7"" . . . in a colinear arrangement, while the microwave plasma sources 9, 9', . . . and the glow wires 7, 7', 7", 7"" . . . are arranged in alternating sequence, preferably equidistantly. Typically, the spacing of the glow wires 7, 7', 7", 7"" . . . from the substrate surface is made to be smaller than the distances between the microwave plasma sources 9, 9', 9" . . . and the substrate 5. The glow wires 7, 7', 7", 7"" . . . are fed with a direct-current potential of electric currents. The power resulting from the direct-current voltages and the currents is selected such that the temperatures of the glow wires are between 2000° C. and 3000° C. The voltages of the currents required for this purpose depend upon the geometry of the glow wires 7, 7', 7", 7"" . . . (length and diameter) and on the glow wire material. During the coating process the substrate 5 with the substrate holder 3 can be moved periodically (in the direction of the broken double arrow) in order to optimize the uniformity of the coating process.

It is important to the invention that a close network of gas inlet tubes 11, 11', 11" . . . be provided above the substrate surface to be coated, and surmounted by a likewise close network of gas outlet tubes 12, 12', 12", 12"" . . . and 13, 13', 13" and 13a, 13b, 13c . . . , both gas supply and connecting tubes as well as the tube sections extending across the plasma sources 9, 9', 9" . . . running parallel to one another, and tube sections perpendicular to the substrate plane, being provided for the input of gas and for gas extraction. The network of gas input and gas outlet is constructed such that all parts of the substrate are exposed to approximately equal gas flows as well as plasma fields.

What is claimed is:

1. An apparatus for depositing polycrystalline diamond onto a flat substrate, comprising a process chamber;

an airlock for the entry and exit of the substrates;

a system within the process chamber for passing the substrates through the process chamber;

a plurality of microwave plasma generating sources each having a linear microwave radiation tube, said plurality of microwave plasma generating sources being arranged parallel to one another and in a common plane above the substrate and extending transversely across the direction of substrate movement;

a plurality of gas inlet tubes, each gas inlet tube having an inlet opening that communicates with said process chamber, wherein said inlet openings are situated immediately above said corresponding microwave plasma sources and distributed over the length of the linear microwave radiation tube;

a plurality of gas outlet tubes, each gas outlet tube having an outlet opening that communicates with said process chamber, each of said gas outlet tubes being associated with a microwave plasma generating source and positioned in an area between adjacent microwave plasma generating sources and in a plane which extends approximately through the core axes of said microwave plasma generating sources.

2. The apparatus of claim 1, wherein the distance from one linear source to the adjacent linear source and the distance of the one gas inlet tube to the adjacent gas inlet tube and the distance from one gas outlet tube to the adjacent gas outlet tube are approximately equal.

\* \* \* \* \*